United States Patent [19]

Auriana

[11] 4,245,877
[45] Jan. 20, 1981

[54] CIRCUIT PACKAGE RECEPTACLE WITH MOVABLE BASE SEPARATION MEANS

[75] Inventor: Mark Auriana, Stamford, Conn.
[73] Assignee: Burndy Corporation, Norwalk, Conn.
[21] Appl. No.: 755,759
[22] Filed: Dec. 30, 1976
[51] Int. Cl.³ .............................................. H01R 13/62
[52] U.S. Cl. .............................. 339/74 R; 339/17 CF; 339/36; 339/75 MP
[58] Field of Search ............ 339/40, 41, 17 CF, 74 R, 339/75 R, 75 MP, 75 P, 75 T, 75 M, 176 MP, 36

[56] References Cited

U.S. PATENT DOCUMENTS

| 1,938,039 | 12/1933 | Propp | 339/41 |
| 2,635,131 | 4/1953 | Greatbatch, Jr. | 339/41 |
| 3,713,074 | 1/1973 | Pasbrig | 339/41 |

FOREIGN PATENT DOCUMENTS

| 50013 | 9/1911 | Austria | 339/41 |
| 832011 | 2/1952 | Fed. Rep. of Germany | 339/41 |
| 1321024 | 2/1963 | France | 339/41 |
| 686380 | 3/1965 | Italy | 339/75 M |
| 228731 | 6/1969 | U.S.S.R. | 339/75 M |

OTHER PUBLICATIONS

IBM Tech. Discl. Bulletin, Branson et al., vol. 17, No. 1, 6-1974, p. 138.
IBM Tech. Discl. Bulletin, Kehagioglou, vol. 11, No. 10, 3-1969, p. 1295.

Primary Examiner—Neil Abrams
Attorney, Agent, or Firm—Howard S. Reiter

[57] ABSTRACT

This invention relates to printed circuit board electrical circuit receptacles. One embodiment is a receptacle for receiving the connector prongs of a modular circuit component package of the so-called "dual in-line" type. Such contacts are retained by high pressure contact with the edges of its separate receptacle contact elements. Removal of the package is facilitated through operation of a movable element of the receptacle, which causes the prongs to slide laterally out of contact with the receptacle contact elements.

11 Claims, 11 Drawing Figures

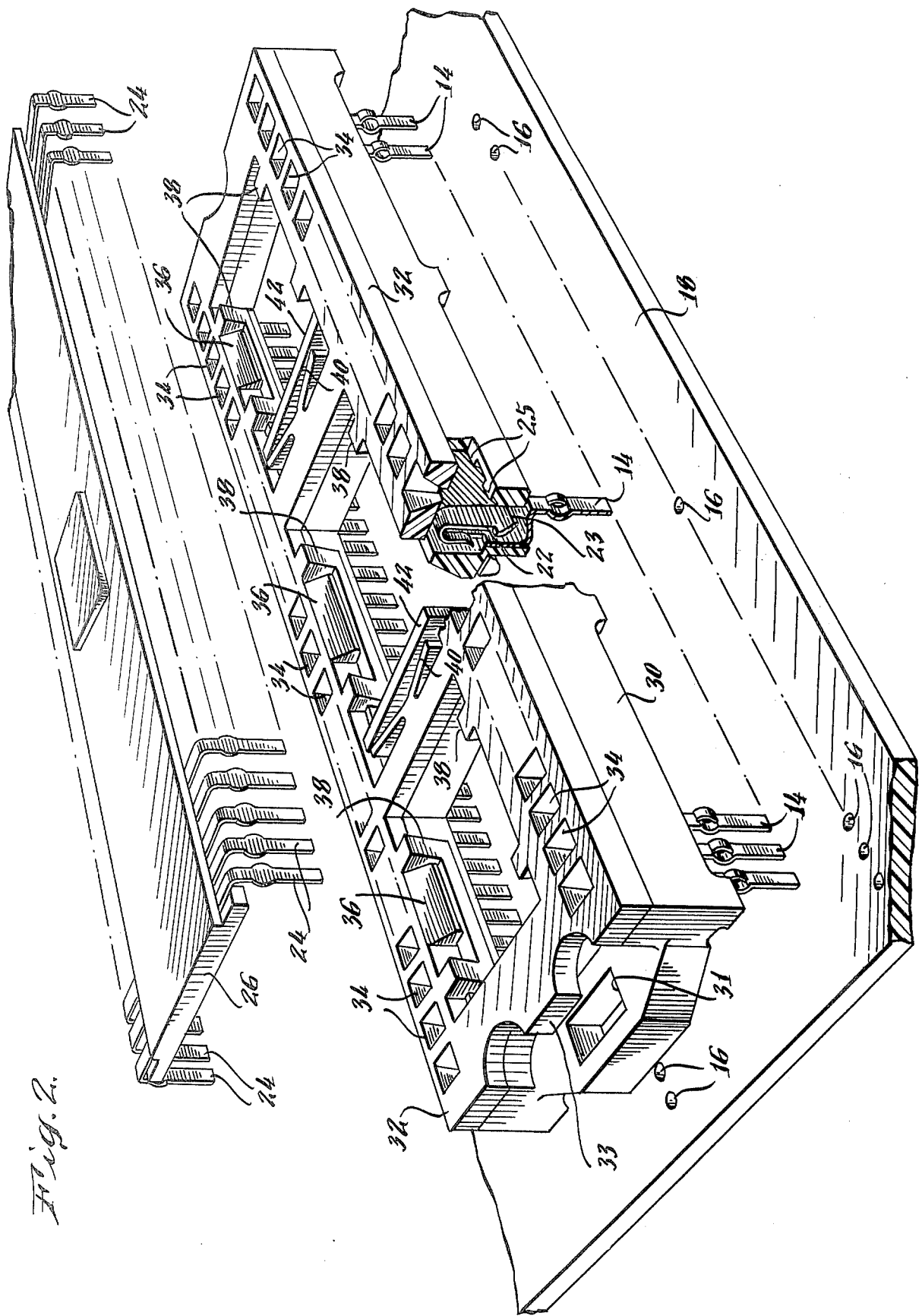

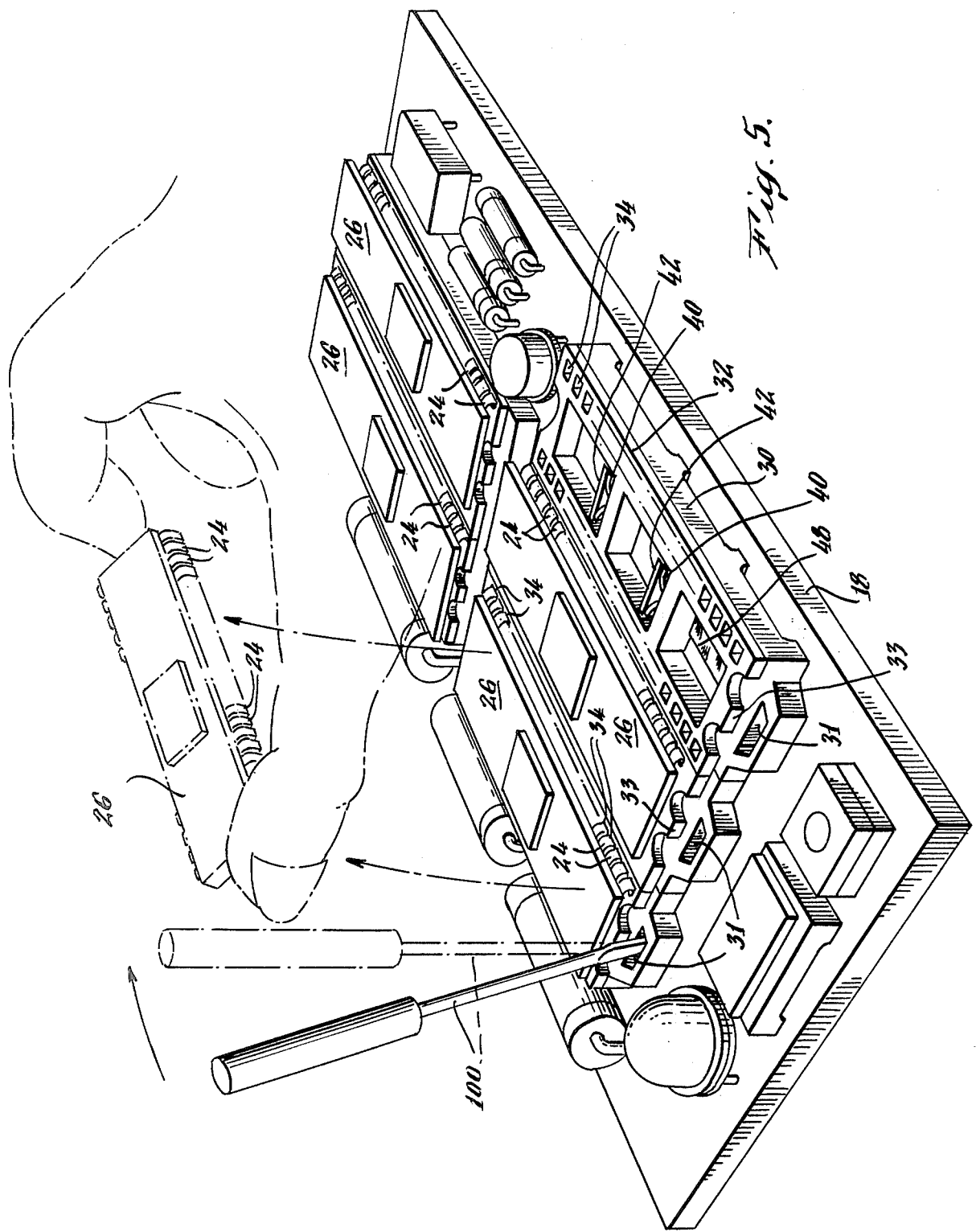

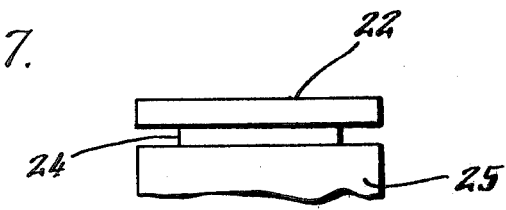
Fig. 7.
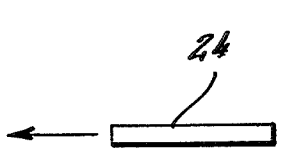
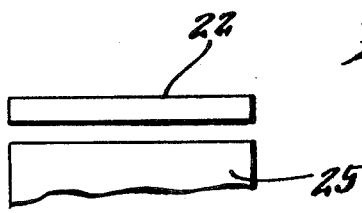
Fig. 8.
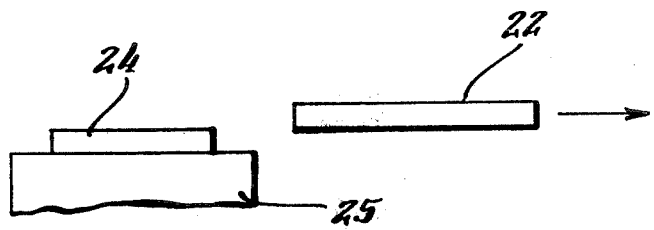
Fig. 9.
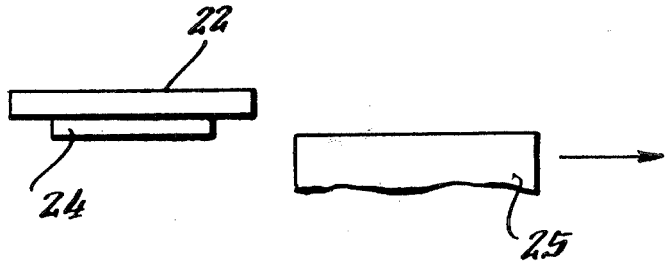
Fig. 10.

CIRCUIT PACKAGE RECEPTACLE WITH MOVABLE BASE SEPARATION MEANS

BACKGROUND OF THE INVENTION

In the field of electrical connectors, particularly those relating to printed circuit boards, frequently it is desired to have a receptacle into which a component package including elements such as an integrated circuit "chip", may be removably inserted. Such packages frequently comprise "active" elements affixed to a base across which conductive circuitry extends from one or more of the elements to connector prongs oriented substantially parallel to each other and at right angles downward from the bottom of the base of the package. Such component packages may thereby be interconnected with other circuit components by thrusting the connector prongs into position between spring loaded receptacle contacts. Typically the voltages and currents involved in such applications are small, so it is desirable and usually necessary for the pressure exerted by the spring-like receptacle contacts on the exterior of the package prongs to be very high in order to ensure that effective electrical interconnection is achieved. Since the component package is fragile and the connector prongs extending downward from the base of the package also are relatively fragile, both are rendered highly susceptible to bending, breakage and other derogatory effects, particularly when an attempt is made to remove the package from the receptacle against the strong retention forces of the receptacle contact elements. Various mechanisms have been proposed for use with receptacle devices to circumvent these problems, but typically they tend to be complex structurally and mechanically, and therefore costly to construct and to occupy circuit board surface that might otherwise be utilized to greater advantage.

Accordingly, it is an object of this invention to provide an effective receptacle means for dual in-line component packages.

Another object of this invention is to produce such means wherein removal of such packages therefrom will be facilitated.

Still another object of this invention is to produce such means wherein such removal may be accomplished without objectionable derogatory effect to the component package or the prongs projecting from the bottom of the package.

Yet another object of this invention is to provide such means in a form and structure which will be mechanically simple and relatively inexpensive to construct and operate.

Another object of this invention is to provide such means in a form which will permit greater utilization of available circuit board surface.

SUMMARY OF THE INVENTION

Desired objectives may be achieved through practice of the present invention which, in one embodiment, comprises a printed circuit board receptacle for the contact prongs of dual in-line packages wherein said receptacle has either contacts, or prong backing surfaces, or prong guides which are movable laterally at right angles to the direction of insertion of the package prongs, whereby, through such movement, prongs residing in slots described by contacts and associated backing surfaces, may be disengaged from each simultaneous contact with both a contact and a backing surface, thereby freeing the package for easy removal from the receptacle.

DESCRIPTION OF DRAWINGS

This invention may be clearly understood from the description which follows and from the attached drawings in which FIG. 2 is a perspective view of an embodiment of this invention, FIG. 5 is another perspective view of the embodiment of this invention shown in FIG. 2, FIGS. 6a and 6b depict another embodiment of this invention, FIG. 7 depicts another embodiment of this invention, FIG. 8 depicts another embodiment of this invention, FIG. 9 depicts another embodiment of this invention, and FIG. 10 depicts another embodiment of this invention.

DESCRIPTION OF PREFERRED EMBODIMENTS

Figure 1:
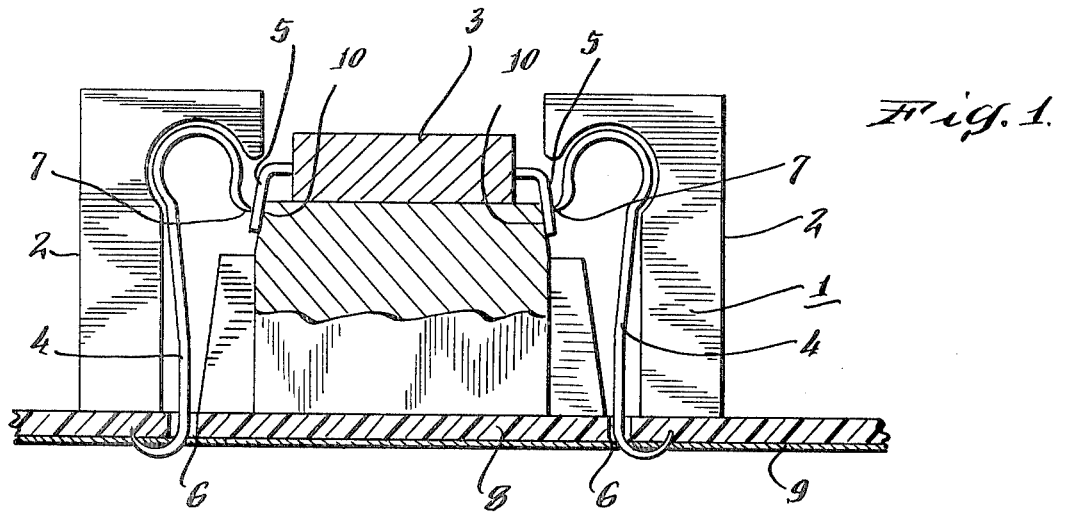
FIG. 1 is a cross-sectional view of a printed circuit board receptacle of the type herein contemplated, with an associated dual in-line component package in place.

Referring first to FIG. 1, there is depicted a cross-section of a printed circuit board receptacle (1) for so-called "dual in-line" component packages. As illustrated, it comprises sidewalls (2) in which are positioned receptacle connector contact elements (4) which extend downward through holes (6) in an associated printed circuit board (8) for interconnection, as by soldering or other appropriate means, with conductive paths (9) on the printed circuit boards. The contacts (4) present an angled contact point (7) to the surface of the connector prongs (5) of an associated component package (3), in order to ensure a reduced area and high unit area pressure, to achieve effective electrical contact therebetween. Preservation of such good contact is enhanced by backer surfaces (10) which inhibit the prongs (5) from deflecting inward in response to pressure therein by the contacts (4). As will be apparent from FIG. 1 however, such an arrangement, while important to good electrical connection between the component parts of the package and the receptacle, tends to make it even more difficult to remove the package from the receptacle since high work forces are necessary to do so and because, as a practical matter, it is virtually impossible to lift the component package (3) straight upward and out of the receptacle (1), thereby tending to cause breakage, bending or other derogatory effects on the fragile contact members (5) of the component package (3) and for the component package itself.

FIG. 2 depicts an embodiment of the present invention for electrically interconnecting the contact prongs (24) of a circuit component "package" (26) with receptacle contact clips (22) having contact edges (23), which clips (22), together with corresponding backer surfaces (25), form slots into which prongs (24) may be inserted. Although the backer surfaces (25) are illustrated in FIG. 2 as planar plateaus, they might be of any of a variety of other shapes such as domes, semi-cylinders, linear arrays, etc. The receptacle contact clips (22) which have tail portions (14) extending through holes

(16) in a printed circuit board (18) so as to interconnect with conductive paths (not shown) on the printed circuit board. It will be noticed that the foregoing elements correspond to elements shown in FIG. 1. However, the embodiment shown in FIG. 2 has a main receptacle body (30) to which are affixed one or more arrays of contacts (22), on top of which is positioned a receptacle member which, in this embodiment, is in the form of a slideable cover (32). The main body includes a tool port (31) formed integrally therewith for the purposes hereinafter described. Since, as shown in FIG. 2, the clips (22) are arrayed in straight linear arrays, one along each edge of the main body (30), so that they will correspond to the prongs (24) of the package (26), the cover (32) includes corresponding linear arrays of apertures (34) through which the prongs (24) may be inserted into the slots in concurrent juxtaposition with the bearing edges (23) of the contact clips (22), and the backer surfaces (25). However, it should be noted that as used herein, the term "linear array" is not intended to imply any limitation to the arrays being in straight lines as shown in FIG. 2. For example, it is within the contemplation of this application that the receptacle contact array might be circular and the cover circularly movable with respect thereto, for the purposes hereinafter described. Further, although the apertures (34) are depicted in FIG. 2 as being completely surrounded by cover material, it will be clear that it is not necessary for them to be so surrounded on all four sides. Thus, for example, the apertures might open to the outside of an edge of the cover (32), and if it is desired in such a case to protect the outside exposure of the prongs (24) after they have been inserted, the cover (32) may be surrounded by a bordering flange (not shown) at the top of the sides of the main body (30). Such an arrangement would also provide for the apertures being in a region of the cover (32) adjacent to the connector contact clips (22).

The cover (32), which has a tool abutment (33) integral therewith for the purposes hereinafter described, may be slideably interconnected with the main body (30) by means of being snap-fitted thereon through the cooperative interengagement between latches (36) that are integral with the inside of the outer wall of the main body (30) and latch riders (38) that are integral with the cover (32). Since the latch riders (38) are longer than the latches (36) with which they are associated, the cover (32) is free to move by sliding along the top of the main body (30) in a direction which is substantially perpendicular to the direction of insertion of the prongs (24) into juxtaposition with the contacts (22).

Biasing means, in this illustration, in the form of cantilever springs (40) integral with the cover (32), acting cooperatively with partitions (42) integral with the main body (30), serve normally to bias the cover (32) into a position such that the apertures (34) are juxtaposed to the desired corresponding contacts (22).

Figure 3:
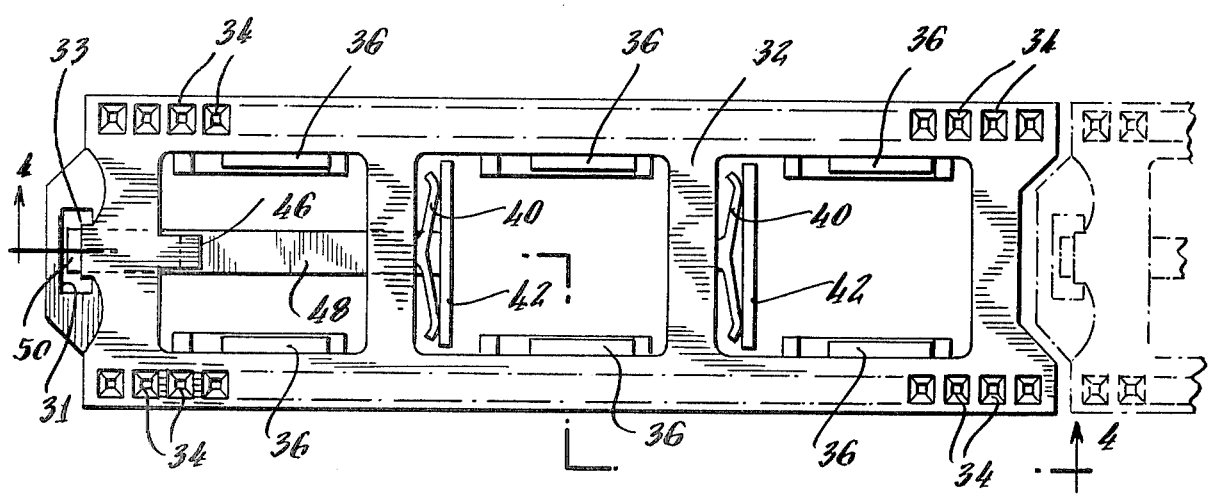
FIG. 3 is a plan view of a portion of the embodiment of this invention shown in FIG. 2.
Figure 4:
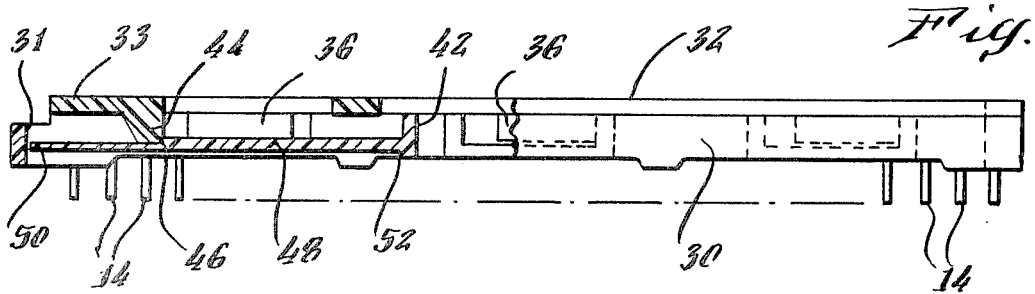
FIG. 4 is a side view of the portion of this invention shown in FIG. 3, p

FIGS. 3 and 4 are a plan view and a cross-sectional side elevation respectively, illustrating structure to ensure that the cover (32) and associated circuit component "package" (26) when correctly positioned cannot be moved inadvertently, as hereinafter described. As shown, a latch (44) may be formed integrally with the cover (32) facing downward near one end, corresponding in position to a notch (46) formed in a cantilever spring (48) having a depressor tongue (50) at the end farthest from its point of connection (52) to the partition (42). From these illustrations, it will be apparent that the cover (32) may be made free to slide to the right upon depression downward of the tongue (50) of the beam spring (48), with consequent unlatching of the latch (44) from the notch (46).

From the foregoing, it will be clear that it may be advantageous to form the components of the present invention from materials such as plastics which are inexpensive, readily moldable, resilient, electrically insulated, and have other properties suitable for the intended use. However, other materials may be combined to yield appropriate results, such as metals, insulations, springs, and the like.

FIG. 5 illustrates how the aforesaid embodiment of this invention may be used. It depicts a printed circuit board including a number of receptacles of the type herein described in FIGS. 2, 3 and 4. As has been discussed in connection with FIG. 1, the sharp, biting effect of the edge (23) of each contact clip (22) on the connector prong (24) associated with it, backed, as it is, by a backer surface (25), makes it difficult, if not impossible, to remove the circuit component "package" (26) without damaging the prongs. However, with the present invention, a screwdriver (100) may be inserted into the tool port (31), until it impinges upon the tongue (50) of the lever arm (48), if one optionally has been employed, depressing the arm (48) downward so as to disengage the latch (44) on the cover from the notch (46) on the lower arm; the screwdriver (100) may then be pivoted to press upon the tool abutment (33), causing the cover (32) to slide horizontally in a direction perpendicular to the direction of insertion of the prongs (24). By this means, each prong (24) may be caused to slide past the biting edge of the contact with which it is associated; all of the prongs being moved simultaneously, until each one is free from engagement with an associated contact. The circuit component package may then be freely and easily removed from the receptacle without objectionable effect on any of the prongs (24). Following such removal, the associated bias means (e.g., the beam spring (40) acting upon the partition (42) will cause the cover to move back to its original position, blocked against further lateral movement by the combination of cooperating latch (44) and notch (46), ready for receipt of the same or another circuit package.

It will be apparent from the foregoing, that although parallel, straightline arrays of connectors, positioned on opposite sides of the receptacle cover, have been illustrated, other embodiments are within the contemplation of this invention as well. Thus, one or more connector arrays, straight or arcuate, according to the configuration of the circuit "package" and the direction of relative motion between the cover and the main body of a given receptacle, may be positioned at various locations in the constituent parts of receptacles made in accordance with this invention.

Figure 6A:
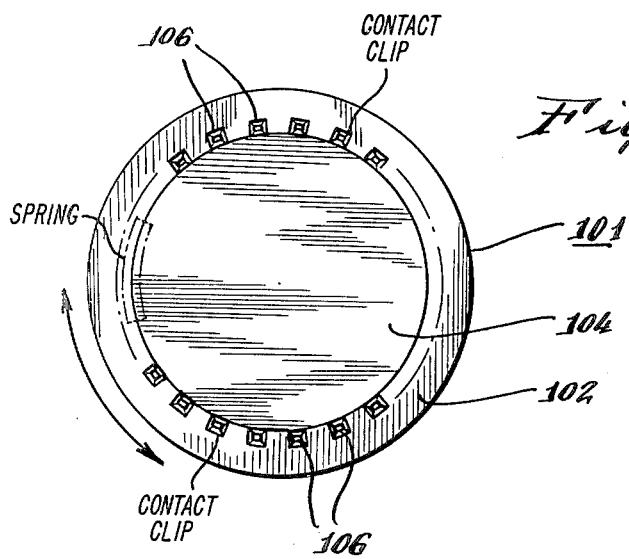
Figure 6B:
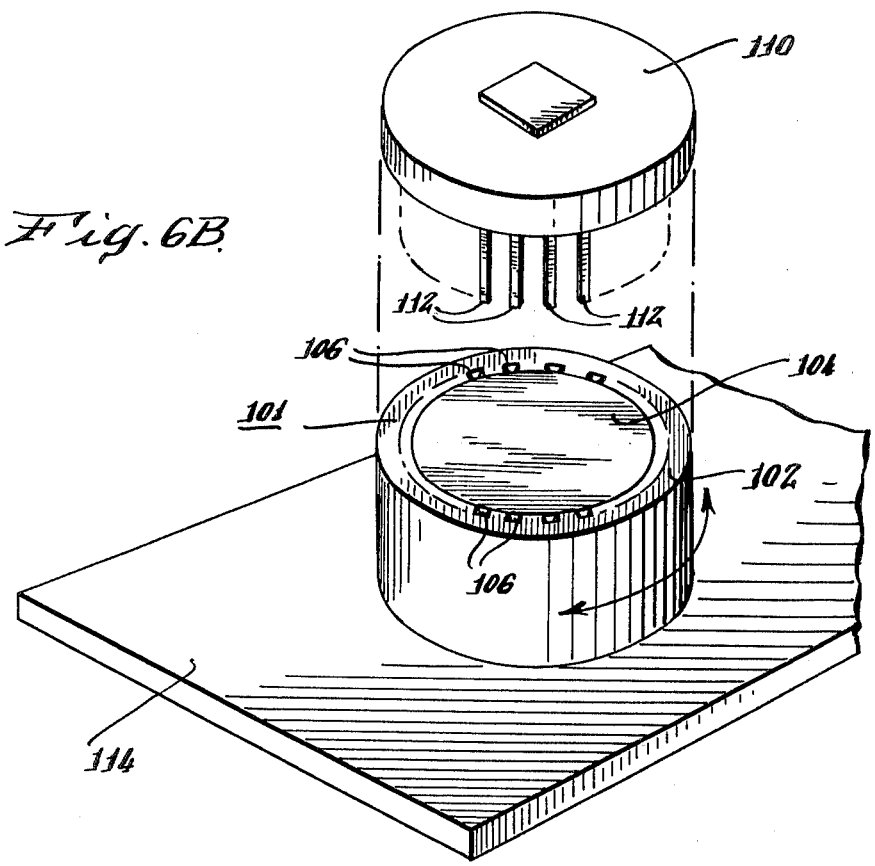

FIGS. 6a and 6b depict another embodiment of this invention which is illustrative of this fact. As shown, the receptacle (101) is round and comprises a receptacle member in the form of an outer, torsionally movable, cylindrical sleeve (102) which has prong receptacles (106) on its inner periphery and closely surrounds a main body (104). The member (102) may be biased toward a position relative to the main body (104) such that the apertures (106) are juxtaposed to contact clips (not shown) of the type heretofore described that are affixed to the main body (104), by known per se means, such as a helical spring impelling the member (102) against a stop integral with the main body (104). It will be clear from FIG. 6b that a circuit component package (110) may have its prongs (112) positioned in the apertures (106) to effect electrical connection therewith. Thereafter, when it is desired to remove the package, the member (102) may be moved torsionally to cause the prongs (112) to slide out of engagement with the contact prongs, substantially in the fashion of the relative movement effected in the embodiments previously described, permitting easy removal of the component package. It should be noted that embodiments such as this afford special advantages for overcoming factors such as "G" loads or other inertial effects without use of latching arrangements or other devices of the type heretofore described.

While the foregoing descriptions are of currently preferred embodiments, it should be understood that this invention is broader than the embodiments hereinbefore described wherein a member having prong guides is movable with respect to relatively stationary clips and backer surfaces. Thus, the interrelationship of elements is shown in simplified form in FIG. 7, where a circuit package prong (24) is shown in concurrent contact with a contact clip (22) and its associated backer surface (25). FIG. 8 illustrates the relative movement of these elements in the embodiments heretofore described; i.e. wherein by movement of the movable cover (32), the prongs (24) are moved laterally by a distance greater than that necessary to cause the prongs (24) to disengage from concurrent contact by both the clip (22) and the surface (25), whereupon the prong (24) may be easily removed in a direction opposite the insertion direction, or perpendicular or normal to the motion path of the movable cover member (32) and the prongs (24).

However, as is shown in FIG. 9, a comparable releasing effect may be achieved by moving the clip (22) relative to the prong (24) and backer surface (25), by a distance such that the clip (22) no longer bears on the prong (24), thereby releasing the prong for easy removal as described above.

Similarly, as shown in FIG. 10, the prong (24) and the clip (22) may be kept stationary, and the backer surface (25) moved laterally relative thereto. Since this will have the effect of relieving the pressure with which the prong (24) is held against the inherent spring bias of the clip (22), the prong (24) will be free to deflect slightly in the direction away from the clip, thereby permitting easy removal of this prong from contact with the clip.

Embodiments may be made incorporating any of a wide variety of known per se structural means for effecting motion of the backer surfaces and/or the contact clips to achieve the motion effects of the type described above.

I claim:

1. A receptacle for effecting electrical interconnection with a plurality of connector prongs extending in substantially parallel, spaced-apart relationship from a circuit component package, comprising:

a main body made from electrically insulating material and having at least one array of spaced-apart contact elements and having prong backer surfaces juxtaposed to said contact elements; said prong backer surfaces and said contact elements forming therebetween slots for receiving a plurality of substantially parallel, spaced-apart connector prongs from a given insertion direction, so that each such prong may be contacted on one side by a contact element and on the other side by a backer surface, and a guide member having a plurality of guide means for guiding connector prongs into said slots, one or more among the group consisting of said member, said backer surfaces collectively, and said contact elements collectively, being movable along a motion path which is substantially normal to said insertion direction to cause prongs positioned in said slots to become disengaged from concurrent contact by both a contact element and a backer surface by slideably separating said prongs from contact with one or more among the group consisting of said contact elements collectively and said backer surfaces collectively with such relative sliding movement being in the direction of said motion path, said slots being arrayed in a spaced-apart relationship along said motion path with respect to each other.

2. The receptacle of claim 1 including biasing means for normally biasing said guide member against said contact elements.

3. The receptacle of claim 2 including locking means for selectively locking said guide member against movement along said motion path.

4. The receptacle of claim 2 wherein said biasing means is a resilient spring.

5. The receptacle of claim 2 wherein said slots are arrayed in an arcuate line.

6. The receptacle of claim 1 including locking means for selectively locking said guide member against movement along said motion path.

7. The receptacle of claim 6 wherein said locking means is released by a tool.

8. The receptacle of claim 7 wherein said tool releases said locking means while urging said guide member to move relative to said main body along a path substantially orthogonal to said insertion direction.

9. The receptacle of claim 8 including a resilient spring for normally biasing said guide member against said contact elements.

10. The receptacle of claim 9 wherein said guide member is movable with respect to said main body along said motion path.

11. The receptacle of claim 1 wherein said slots are arrayed in an arcuate line.

* * * * *